United States Patent
Morita et al.

[11] Patent Number: 5,990,553
[45] Date of Patent: Nov. 23, 1999

[54] METAL-BASED SEMICONDUCTOR CIRCUIT SUBSTRATES

[75] Inventors: Moritsugu Morita; Hirofumi Tanaka; Kazuhito Fujita, all of Kanagawa, Japan

[73] Assignee: Mitsui Chemicals, Inc., Tokyo, Japan

[21] Appl. No.: 09/055,232

[22] Filed: Apr. 6, 1998

[30] Foreign Application Priority Data

Apr. 9, 1997 [JP] Japan .................................. 9-090794
Feb. 19, 1998 [JP] Japan .................................. 10-037653

[51] Int. Cl.$^6$ .................................................. H01L 23/06
[52] U.S. Cl. ............................ 257/729; 257/699; 257/787
[58] Field of Search .................................. 257/699, 701, 257/702, 706, 707, 709, 687, 787, 729; 361/713, 719, 720; 174/252, 258

[56] References Cited

U.S. PATENT DOCUMENTS

| 3,364,400 | 1/1968 | Granberry | 257/699 |
| 5,521,437 | 5/1996 | Oshima et al. | 257/687 |
| 5,751,058 | 5/1998 | Matsuki | 257/687 |
| 5,834,850 | 11/1998 | Hotta et al. | 257/687 |

*Primary Examiner*—Sheila V. Clark
*Attorney, Agent, or Firm*—Burns, Doane, Swecker & Mathis, LLP

[57] ABSTRACT

Polyimide layers having special properties are formed on the bottom surface of a metallic body for a metal-based semiconductor circuit substrate with a polyimide layer as an insulator. There are four lamination methods: (a) a method in which a layer of thermoplastic polyimide resin (1) and a layer of non-thermoplastic polyimide resin are laminated on the bottom surface of the metallic body one over another in this order, (b) a method in which a layer of thermoplastic polyimide resin (1), a layer of non-thermoplastic polyimide resin and a layer of thermoplastic polyimide resin (2) are laminated on the bottom surface of a metallic body one over another in this order, (c) a method in which a layer of non-thermoplastic polyimide resin is laminated on the bottom surface of a metallic body and (d) a method in which a layer of thermoplastic polyimide resin (2) is laminated on the bottom surface of a metallic body. The resulting semiconductor circuit substrate has improved properties: flat joins to connect external terminals, small variations in shape due to temperature changes, the mounting properties to a mother board, the absorption efficiency of infrared rays during solder reflowing, plating resistance and the bonding reliability to other objects.

14 Claims, 5 Drawing Sheets

METAL-BASED SEMICONDUCTOR CIRCUIT SUBSTRATES

BACKGROUND OF THE INVENTION

The present invention relates to metal-based semiconductor circuit substrates and a process for producing the same. Particularly, the present invention relates to metal-based semiconductor circuit substrates which are light and easy to process and whose bonding reliability to an external circuit substrate is excellent, and a process for producing the same.

These days metal-based semiconductor circuit substrates have been used extensively in industry to produce semiconductor packages of microcomputers, microprocessors and other devices.

Typical examples of metal-based semiconductor circuit packages include a metal-based ball grid array (BGA) package disclosed in U.S. Pat. No. 5,420,460 and a metal-based metal quad package (MQP) disclosed in JP-A-6-53621 (Tokkaihei) (U.S. Pat. No. 5,639,990). The latter discloses that a metal-based wiring substrate is drawn to be box-shaped and that leads are formed in the periphery of its opening to obtain an MQP.

It is said that metal-based semiconductor substrates have characteristics such as heat radiation and electromagnetic shielding properties. A metallic body, which is used for a metal-based semiconductor circuit substrate, plays a part in reinforcing its circuit, in releasing heat generated in a semiconductor or in passing electricity to the ground. In a metallic body, a circuit is formed on its top surface and its bottom surface is opposite to the top surface. The bottom surface plays a part in releasing heat generated in a metal-based semiconductor circuit substrate and in absorbing infrared rays (IR) in mounting the metal-based semiconductor circuit substrate to a mother board by IR reflowing. In some cases the bottom surface plays a part in insulating.

JP-A-07-321250 (Tokkaihei) (U.S. Pat. No. 5,583,378) discloses that a protective layer, made of epoxy resin or suitable material other than epoxy resin, can be formed on the bottom surface of a conventional metal-based semiconductor circuit. The bottom surface plays a part just in protecting the conventional metal-based semiconductor circuit substrate. The bottom surface is usually the surface of a stainless steel plate or copper plate treated with zinc chromate, or is covered with a protecting layer of nickel (Ni) plating, a protecting layer consisting of nickel and gold (Au) plating layers or an epoxy resin layer.

When the bottom surface of a metallic body is not covered with an epoxy resin layer, the bottom surface has a small coefficient of radiation heat transfer, a small amount of radiation in heat release and a small amount of IR absorbed in a reflowing furnace, especially, an IR reflowing furnace. The temperature of a package is lower than that of a QFP or other parts mounted on a mother board in a reflowing furnace. Therefore, there is a narrow margin for the conditions of a reflowing furnace in which various parts are mounted at the same time; thus, the solder bonding becomes unstable.

Especially when a metal-based circuit substrate is produced to form a circuit, wire bond pads are nickel- and gold-plated at the same time as its bottom surface. The bottom surface is gold-plated although gold plating is unnecessary; therefore, gold plating increases the production costs of the metal-based semiconductor circuit substrate. Copper (Cu) is often used for a metallic body because of thermal and electric properties. In these cases, a type of a bimetal is formed because a nickel plating layer has a smaller coefficient of thermal expansion than a copper body; thus, changes in temperature bring about the deformation of a package.

A metal-based semiconductor circuit substrate having a metallic body of 0.1 to 0.4 mm in thickness is defined as a thin metal-based semiconductor circuit substrate. A stainless steel or copper plate is often used for a metallic body of a thin metal-based semiconductor circuit substrate. Especially a plate of copper or copper alloy, which has excellent heat transfer and electric properties, is often used. However the resulting circuit substrate has less flexural rigidity and is easy to deform due to temperature changes.

A warp appears when materials with different coefficients of thermal expansion are used for a metal-based semiconductor circuit substrate. Typical examples of coefficients of thermal expansion at 25° C. are almost as follows:

(1) a layer consisting of Ni- and Au-plating layers: $13 \times 10^{-6}$/deg.

(2) a metallic body made of stainless steel, copper or a copper alloy: $17 \times 10^{-6}$/deg.

(3) a polyimide resin layer for insulating a circuit: $20$–$55 \times 10^{-6}$/deg.

(4) a copper foil for a circuit: $17 \times 10^{-6}$/deg.

(5) a layer of resist ink: $60$–$80 \times 10^{-6}$/deg.

When a laminate is observed from the viewpoint of coefficients of thermal expansion as shown above, the coefficients of thermal expansion ascend in the z-axis direction. When the temperature of a circuit substrate is increased, a warp appears so that its bottom surface becomes concave.

When a metallic body is at most 0.4 mm thick, especially at most 0.2 mm thick, it has less flexural rigidity. An example is disclosed in a display of High Performance Cavity-Down Metal-Based BGA (MeBGA) Package (TECHNICAL DIGEST, page 153), published in the Third VLSI PACKAGING WORKSHOP of Japan, December, 1996. When a semiconductor substrate has holes for detecting terminals in its metallic body, the metallic body, on which balls are mounted, decreases in area and the semiconductor substrate further decreases in flexural rigidity. When the temperature of the semiconductor substrate is increased, a warp becomes large. When a semiconductor substrate is mounted on a mother board with solder balls, for example, the semiconductor substrate is excellent in flatness at 25° C. and can be mounted easily. However, a warp appears in the substrate at a melting temperature of solder balls of 185° C.; thus, the solder balls in the corners are raised and suitable solder ball bonding is prevented. A warp appears in a semiconductor substrate when the temperature of the semiconductor substrate changes. When the semiconductor substrate is mounted on a mother board, such a warp is a large influence on the bonding reliability of solder balls.

The equation of Coffin-Manson was used to simulate the bonding reliability of solder balls, based on a stress analysis method. It is shown that the life of solder ball bonding varies in the range of many times or over according to the size of a warp.

The following method are considered to solve these problems.

The first method is to form an epoxy resin layer with a large coefficient of thermal expansion on the bottom surface of a metallic body. The second is to increase a metallic body in thickness and flexural rigidity in order to counter a stress resulting from the difference between coefficients of thermal expansion. The third is to use as a metallic body a metal with an extraordinarily large amount of flexural rigidity in order to increase the metallic body in flexural rigidity and to counter a stress resulting from the difference between coefficients of thermal expansion. The fourth is to use a polyimide resin having a smaller coefficient of thermal expansion in order to insulate a circuit. The fifth is to use a solder resist layer thinner than conventional solder resist layers. The sixth is to use a solder resist having a smaller coefficient of thermal expansion.

When an epoxy resin layer is formed on the bottom surface to improve IR absorption and counter a warp, the epoxy resin layer, however, accompanies various problems. The first problem appears when an epoxy resin layer is formed on the bottom surface of a metallic body in advance and the metallic body is used. When a cavity structure is formed by drawing, cracks appear in the epoxy resin layer and the resulting metal-based semiconductor circuit substrate deteriorates in durability and reliability as well as in appearance. The second appears when a resin layer is formed on a part of the bottom surface other than a drawing part using an epoxy-type resist ink in order to avoid cracks. When the resulting substrate is drawn, the substrate's drawing shape deteriorates in precision due to the difference in level between a place where a resin layer is formed and a place where no resin layer is formed. Such a substrate is unsuitable for mounting a semiconductor. The substrate also needs a mask so that the metallic body in the drawing part, exposed during forming a circuit on the top surface, is prevented from being exposed to an etching solution.

The third appears when detecting terminals are formed on the bottom surface due to a fine pattern. It is difficult to form an epoxy resin layer only on a part of the bottom surface where there are no detecting terminals. It is also possible that a cavity is formed and then an epoxy resin layer is formed by electrodeposition. This case, however, accompanies high production costs. Due to adhesive property, used in an epoxy resin which has a lower glass transition temperature and is softer. When such an epoxy resin is used in wire bonding, it is tacked to a jig for heating a substrate. In some electronic circuits, unnecessary parts are coated by electrodeposition using an epoxy resin.

When a thick metallic body is used, the resulting metal-based semiconductor circuit substrate becomes heavy and causes a circuit and a dielectric layer under the circuit to stretch to a considerable degree in drawing and bending. Therefore, when such a circuit substrate is drawn or bent, it is limited in curvature radius due to the stretch of the dielectric layer.

When a metallic body is increased in flexural elastic modulus, there is a limit in that the metallic body deteriorates in bending and drawing.

It is effective to use a polyimide resin having a lower coefficient of thermal expansion in order to insulate a circuit. However, even the polyimide resin cannot counter a solder resist layer having a large coefficient of thermal expansion. A polyimide resin having a lower coefficient of thermal expansion deteriorates in lamination and adhesive properties. The rate of etching with a liquid or a plasma gas is slow. The polyimide resin hinders the formation of via holes. The resulting substrate has a large amount of flexural rigidity and a small elongation percentage. When such a substrate is drawn, the size of its curvature radius is limited and the processing accuracy decreases.

When a solder resist layer is thinner than ordinary resist layers, the solder resist layer deteriorates in reliability.

It is preferred to use a solder resist having a coefficient of thermal expansion smaller than $30 \times 10^{-6}$/deg. It has been impossible to obtain a solder resist, which is photosensitive, can enable to form a fine pattern and has a coefficient of thermal expansion of at most $30 \times 10^{-6}$/deg.

It has been difficult to improve a thin metal-based semiconductor circuit substrate in IR absorption in a reflowing furnace and give plating resistance during keeping its drawing property. Especially, due to various reasons, it has been difficult to reduce the variations in shape of a thin metal-based semiconductor circuit substrate when the temperature of the substrate changes.

FIG. 1 illustrates one of conventional metal-based semiconductor circuit substrates. Metallic body 001 of at least 0.1 mm to at most 5 mm in thickness, dielectric layer 010 of at least 5 $\mu$m to at most 200 $\mu$m in thickness and electric conductor circuit layer 100 of at least 0.5 $\mu$m to at most 100 $\mu$m in thickness are laminated one over another in this order. Protective layer 300 such as nickel plating layer and other layers is on the bottom surface of the metallic body. In some cases, metallic body 001 and electric conductor circuit layer 100 are partly connected to each other with blind via hole (hereinafter referred to as BVH) 200.

FIG. 2 illustrates one of conventional metal-based semiconductor circuit substrates. Dielectric layers 010 and 011 and electric conductor circuit layers 100 and 101 are laminated on a metal-based semiconductor circuit substrate. The substrate has a multi-layered structure. Multi-layered electric conductor circuit layers 100 and 101 are optionally interlayer connected with BVH, interstitial via hole 201 (hereinafter referred to as IVH), through hole (hereinafter referred to as TH) and other connectors.

FIG. 3 also illustrates one of conventional metal-based semiconductor circuit substrates. A part of electric conductor circuit layer 100 is connected to metallic body 001 with BVH 200. A part of the metallic body just under the BVH is processed to form detecting terminal 400 being independent of the metallic body.

Preparation methods of these conventional semiconductor circuit substrates are exemplified as follows.

1) A dielectric sheet and an electric conductor foil are laminated on a metallic body with an adhesive or by use of the adhesive property of the dielectric sheet itself. A circuit is formed in the electric conductor foil according to well-known method. A resist layer is formed on the laminate according to a well-known method. The thus-obtained laminate is Ni-plated or Ni- and Au-plated according to a well-known method.

2) A laminate, formed with a dielectric sheet and an electric conductor foil, is used to form a circuit in the electric conductor foil according to a well-known method. A resist layer is formed on the laminate according to a well-known method. The thus-obtained laminate is Ni- and Au-plated to form a sheet with a circuit according to a well-known method. The laminate is adhered to a metallic body with an adhesive or by use of the adhesive property of the dielectric sheet itself.

3) A dielectric sheet is laminated on a metallic body. An electric conductor circuit is formed on the laminate according to the so-called additive process. A resist layer is formed on the laminate according to a well-known method. The thus-obtained laminate is Ni- and Au-plated according to a well-known method.

4) Epoxy resin is electrodeposited on the bottom surface of the metal-based semiconductor circuit substrate formed according to the above-mentioned Exemplified Methods 1) to 3); thus, an insulating material layer is formed on the bottom surface to give an insulated bottom surface.

5) Bottom surfaces of metallic bodies used in the above-mentioned Exemplified Method 1) to 3) are coated with an epoxy resin in advance.

In the above-mentioned Exemplified Method 1) to 3), the bottom surface of a metal-based semiconductor is also plated as well as wire bond pads (WB pads) on the top surface of it are Ni- and Au-plated. In the above-mentioned Exemplified Method 2), a rustproof layer such as nickel plating layer and other protective layers is often formed on a metallic body and then a sheet with a circuit is laminated on the metallic body. In the above-mentioned Exemplified Method 4), an epoxy resin layer is formed on the bottom surface. The bottom surface is often covered with a protective layer consisting of a metal or an epoxy resin having a property of rust proofing in any case. Therefore, the above-mentioned various problems happen.

SUMMARY OF THE INVENTION

It is a first object of the present invention to provide a metal-based semiconductor circuit substrate which has improved properties: flat joins to connect external terminals, small variations in shape due to temperature changes, the mounting properties to a mother board, the absorption efficiency of infrared rays during solder reflowing, plating resistance and the bonding reliability to other objects.

It is a second object of the present invention to provide a metal-based semiconductor circuit substrate which has a cavity formed by drawing.

It is a third object of the present invention to provide a metal-based ball grid array semiconductor substrate.

It is a fourth object of the present invention to provide a metal-based land grid array semiconductor circuit substrate.

It is a fifth object of the present invention to provide a metal-based semiconductor circuit substrate for a metal quad package.

It is a sixth object of the present invention to provide a process of preventing a metallic body form varying in thickness in the formation step of a circuit and keeping the thickness of the metallic body homogeneous to prepare for drawing or bending.

To achieve the above-mentioned objects, a polyimide resin is used for a dielectric layer on the top surface of a metallic body, a circuit for mounting a semiconductor is formed on the dielectric layer and the following polyimide laminate is formed on the bottom surface of the metallic body. The polyimide laminate has a coefficient of thermal expansion of $14 \times 10^{-6}$ to $60 \times 10^{-6}$/deg. at 25° C. and an elongation percentage of 5 to 120%. The outermost polyimide layer from the metallic body has a glass transition temperature of at least 200° C. The innermost polyimide layer from the metallic body has an amount of adhesive strength to the metallic body of at least 0.5 kg/cm.

Particularly, the above-mentioned objects can be achieved by using any of polyimide layers laminated on the bottom surface as shown in the following to prepare a metal-based semiconductor circuit substrate:

(a) a polyimide laminate which has a two-layer structure and consists of a layer of thermoplastic polyimide resin (1) and a layer of non-thermoplastic polyimide resin:
The layer of thermoplastic polyimide resin (1) is laminated on the bottom surface of a metallic body. The layer of non-thermoplastic polyimide resin is laminated on the layer of thermoplastic polyimide resin (1). The layer of thermoplastic polyimide resin (1) has a glass transition temperature of at least 120° C. to at most 300° C. Its elastic modulus at a temperature 30° C. higher than the glass transition temperature is at most one-hundredth as large as that of the layer of thermoplastic polyimide resin (1) at the glass transition temperature. The layer of non-thermoplastic polyimide resin has a glass transition temperature of at least 200° C. Its elastic modulus at a temperature 30° C. higher than the glass transition temperature is more than one-tenth of that of the layer of non-thermoplastic polyimide resin at the glass transition temperature. A 25-$\mu$m film consisting of the layer of non-thermoplastic polyimide resin alone has an elongation percentage of at least 20%.

(b) a polyimide layer which has an one-layer structure and consist s of a layer of thermoplastic polyimide resin (2) or the above-mentioned layer of non-thermoplastic polyimide resin as shown in (a):
The layer of thermoplastic polyimide resin (2) has a glass transition temperature of at least 200° C. to at most 300° C. Its elastic modulus at a temperature 30° C. higher than the glass transition temperature is at most one-tenth as large as that of the layer of thermoplastic polyimide resin (2) at the glass transition temperature (c) a polyimide laminate which has a three-layer structure and consists of a layer of thermoplastic polyimide resin (1) as shown in (a), a layer of non-thermoplastic polyimide resin as shown in (a) and a layer of thermoplastic polyimide resin (2) as shown in (b):
The above-mentioned objects can be achieved according to the following methods.

First, a copper foil for forming a circuit, a top polyimide layer, a metallic body and a bottom polyimide layer are stacked one over another in this order.

Second, a copper foil for forming a circuit, a top polyimide layer, a metallic body, a bottom polyimide layer and a copper foil are also stacked one over another in this order.

These stacks are joined under heat and pressure to form a substrate. The resulting laminate substrate is processed to form a circuit.

When a metal-based semiconductor circuit substrate, which has a polyimide layer or layers formed on the bottom surface of a metallic body, is drawn, it is easy to produce a metal-based semiconductor circuit substrate which has a ball grid array or land grid array structure with an one-stage or two-stage cavity.

The metal-based semiconductor circuit substrate is also drawn or bent to produce metal-based semiconductor circuit substrate which has a metal quad package structure.

In a metal-based semiconductor circuit substrate with detecting terminals, a polyimide layer over the detecting terminals is optionally etched according to a well-known method using a liquid like hydrazine, a plasma gas like $NF_3$ and other chemical compounds or by laser etching. A remaining polyimide layer, which is not over the detecting terminals, is also used. Both of polyimide etching for forming via holes on the side for forming a circuit and polyimide etching for forming detecting terminals on the bottom side are carried out with a liquid or a gas at the same time.

A metal-based semiconductor circuit substrate, which has a polyimide layer as an insulating material, shows the following excellent results when a polyimide layer or layers is laminated on the bottom surface of a metallic body.

1) A substrate with a polymer layer formed on the bottom surface is drawn as it is to form a cavity.

2) Due to excellent results of plating resistance, a Ni plating layer with a low coefficient of thermal expansion is not laminated on the bottom surface of a metal-based semiconductor circuit substrate. The bottom surface is also not plated with expensive gold.

3) A polyimide layer or layers, which has a larger coefficient of thermal expansion than a nickel plating layer has, is formed on the bottom surface; thus, there are a small change in shape and a small warp in a metal-based semiconductor circuit substrate. Therefore, solder balls are in homogeneous contact with a mother board at 25° C. and a melting temperature of solder.

4) The efficiency of IR absorption on the bottom side is increased and heat is absorbed well in a reflowing furnace. The temperature of solder like that of solder balls becomes equal to that of other discrete parts. The bonding strength of solder like solder balls and other materials becomes excellent.

5) There is a small change in shape due to temperature changes in a metal-based semiconductor circuit substrate. The bonding strength of solder, for example solder balls and other materials, to a mother board is excellent. The bonding reliability of the resulting metal-based semiconductor circuit substrate to a mother board becomes excellent.

DETAILED DESCRIPTION OF THE PREFERRED EMBODIMENTS

Figure 1:
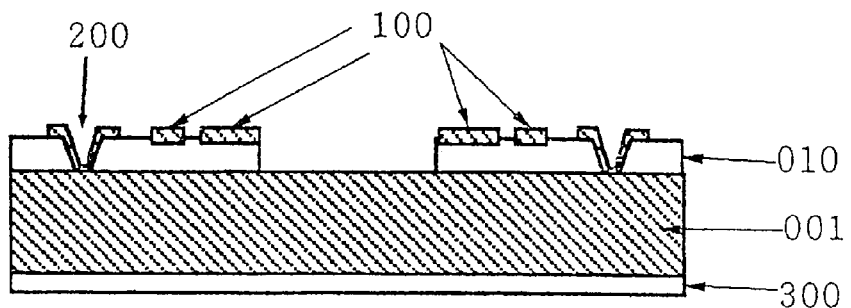
FIG. 1 is a cross-sectional type view of a conventional metal-based semiconductor circuit substrate. The substrate consist of metallic body 001, dielectric layer 010, electric conductor circuit layer 100, BVH 200 and protective layer 300.
Figure 2:
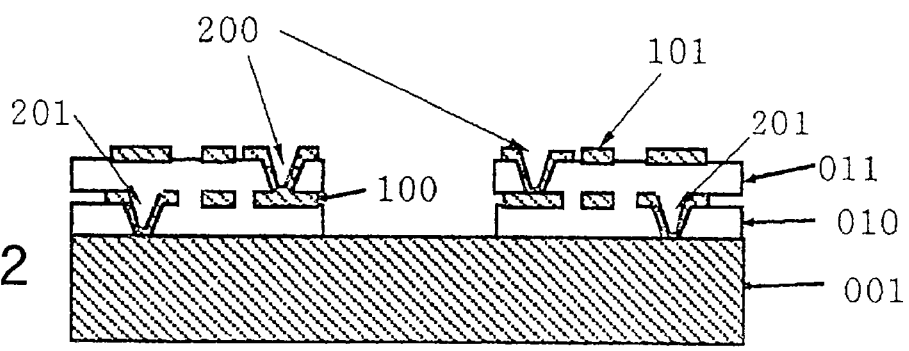
FIG. 2 is a cross-sectional type view of a conventional multi-layered metal-based semiconductor circuit substrate with a two-layer wiring structure. The substrate consists of metallic body 001, first dielectric layer 010, first electric conductor circuit layer 100, second dielectric layer 011, second electric conductor circuit layer 101, BVH 200 connecting the first and second electric conductor circuit layer 100 and 101, and IVH 201 connecting the first electric conductor circuit layer 100 to the metallic body 001.
Figure 3:
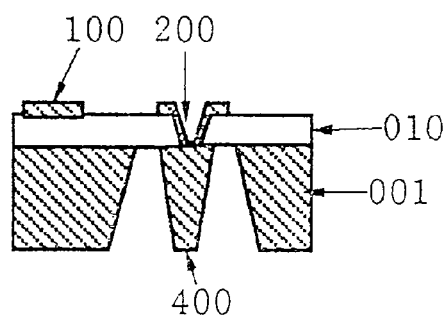
FIG. 3 is a partially cross-sectional type view of a conventional metal-based semiconductor circuit substrate. The substrate consists of metallic body 001, dielectric layer 010, electric conductor circuit layer 100, BVH 200, and detecting terminal 400 formed through etching the metallic body 001.

Polyimide layers, laminated on the bottom surface of a metal-based semiconductor circuit substrate of the present invention, have a coefficient of thermal expansion of $14 \times 10^{-6}$/deg. to $60 \times 10^{-6}$/deg., preferably $17 \times 10^{-6}$/deg. to $60 \times 10^{-6}$/deg., and high qualities of absorption of infrared rays or far infrared rays, elongation, heat resistance and endurability, and are at least 0.1 $\mu$m to at most 50 $\mu$m in thickness.

The polyimide layers give the following effects.

1) The metal-based semiconductor circuit substrate does not deteriorate in drawing quality.

2) When a circuit is Ni- and Au-plated, it is possible to prevent rustproof plating of Ni, an alloy of Ni and P, or other materials having a low coefficient of thermal expansion from being laminated on the bottom surface of the metallic body.

3) It is possible to balance the polyimide layer with a solder resist layer and other layers being laminated on the top surface of a circuit and having a high coefficient of thermal expansion.

4) It is possible to improve the bottom surface in radiation heat transfer.

The thus-obtained substrate has the following characteristics.

1) The bottom surface has an increased coefficient of radiation heat transfer. The bottom surface has an improved quality of IR absorption when the substrate is mounted on a mother board by IR reflowing. When the substrate is mounted by IR reflowing, the metal-based semiconductor circuit substrate and a QFP encapsulated with a resin or other discrete parts equalize in temperature. The equal temperature does not cause a QFP or other discrete parts to deteriorate. When the metal-based semiconductor circuit substrate is joined to a mother board with a solder, the joint strength is increased.

2) Even when the temperature of the metal-based semiconductor circuit substrate changes, the substrate has a reduced amount of shape change.

3) Due to a synergistic effect resulting from items 1) and 2), the metal-based semiconductor circuit substrate has high joint reliability to a mother board.

4) The polyimide layer has plating resistance and prevents adhesion of metallic plating. Especially the polyimide layer can prevent adhesion of Au plating and decrease the metal-based semiconductor circuit substrate in production costs.

5) The polyimide layer has high qualities of elongation, heat resistance and endurability. When the polyimide is laminated, the resulting laminated film has high reliability notwithstanding its thinness. Therefore, the metal-based semiconductor circuit substrate does not deteriorate in heat radiation notwithstanding the existence of the laminated film.

6) The polyimide layer has high qualities of elongation and adhesiveness to a metallic body. When the polyimide is laminated and the resulting laminated substrate is drawn, no cracks appear in the polyimide layer. Therefore, it is possible to form a BGA substrate, an LGA substrate or an MQP substrate having a single-stage or two-stage cavity structure, or a three-stage or more cavity structure, if necessary.

7) A polyimide layer, laminated on detecting terminals, is optionally etched according to a well-known method. It is possible to produce a metal-based semiconductor circuit substrate having detecting terminals when a polyimide layer is laminated on the part of the bottom surface other than the detecting terminals.

8) When a polyimide layer is laminated on the bottom surface of a substrate and the substrate has a two-stage cavity structure, the substrate is suitable for an LGA package or a BGA package with small-sized balls which is a type of a small-sized package as described hereinafter.

8-1) A bonding stitch is formed on the interior surface of a first-stage drawing part, or a first-stage cavity. When an interior surface with a circuit has a relatively large curvature radius resulting from drawing, cracks are prevented from appearing in the circuit. In a second-stage drawing part, or a second-stage cavity, an interior surface without a circuit has a relatively small curvature radius resulting from drawing. The distance between a semiconductor chip and the bonding stitch becomes short. Otherwise, a bonding pad of a semiconductor chip and a bonding stitch are equalized to each other in level; thus, the length of gold wire becomes short.

8-2) The slant surfaces of a drawing part play a part in intercepting a liquefied sealing material. The upper surface of the sealing material does not project over the level of a land part or small-sized balls (0.5 mm or less).

8-3) A substrate is insulated well due to its bottom polyimide layer. Even when the substrate comes in contact with other parts or its case in a narrow space, it is still insulated.

Metallic bodies are excellent in heat transfer. Copper, copper alloys, stainless steel (SUS) and other metals are suitable for the metallic bodies. Especially, copper or copper alloys are preferred because they are excellent in electrical conduction, drawing and bending processing as well as heat transfer.

Methods for laminating a polyimide layer on the bottom surface of a metallic body are divided broadly into two main groups. First, a thermoplastic polyimide layer is used as an adhesive layer and joining is carried out under heat and pressure. Second, a varnish of a polyimide resin or its precursor, provided with an adhesive property, is coated on a metallic body to carry out drying, and imidation, if necessary. It is hard to carry out a roll-to-roll type varnish coating according to the second method because the thickness of the metallic body is 0.1 mm or more. When substrates are coated and dried one by one, productivity is low. Therefore, it is easy to carry out the first method in which the thermoplastic polyimide layer is used as the adhesive layer.

Illustrated hereinafter are examples of preparation processes in which thermoplastic polyimide layers are used for adhesive layers.

Process 1) A metallic body, a layer of thermoplastic polyimide resin (2) and a copper foil are stacked one over another in this order. Joining is carried out under heat and pressure and the copper foil is removed according to a well-known method.

Process 2) A layer of thermoplastic polyimide resin (2) is stacked over a metallic body. A Teflon film, which has extremely small adhesion to the layer of thermoplastic polyimide resin (2), is stacked over the layer of thermoplastic polyimide resin (2). Joining is carried out under heat and pressure and the Teflon film is peeled off.

Process 3) A metallic body, a layer of thermoplastic polyimide resin (1) and a layer of non-thermoplastic polyimide resin are stacked one over another in this order. Joining is carried out under heat and pressure.

4) A varnish of thermoplastic polyimide resin (1) or its precursor is coated on a film of non-thermoplastic polyimide resin. Drying and imidation are carried out. The resulting layers are stacked over a metallic body with the surface of the layer of thermoplastic polyimide resin (1) being in contiguous relation with the surface of the metallic body.

Process 5) A varnish of a precursor of non-thermoplastic polyimide resin and a varnish of a precursor of thermoplastic polyimide resin (1) are coated on a copper foil in this order. Drying and imidation are carried out. The resulting layers are stacked over a metallic body with the surface of the layer of thermoplastic polyimide resin (1) being in contiguous relation with the surface of the metallic body. Joining is carried out under heat and pressure and the copper foil is peeled off according to a well-known method.

Process 6) A metallic body, a film of thermoplastic polyimide resin (1), a film of non-thermoplastic polyimide resin and a film of thermoplastic polyimide resin (2) are stacked one over another in this order. Moreover, a Teflon film, which has extremely small adhesion to the layer of thermoplastic polyimide resin (2), is stacked over the layer of thermoplastic polyimide resin (2). Joining is carried out under heat and pressure and the Teflon film is peeled off.

Process 7) A varnish of thermoplastic polyimide resin (1) or its precursor is coated on one surface of a film of non-thermoplastic polyimide resin. A varnish of thermoplastic polyimide resin (2) or its precursor is coated on another surface of the film of non-thermoplastic polyimide resin. Drying and imidation are carried out. The resulting layers are stacked over a metallic body with the surface of the layer of thermoplastic polyimide resin (1) being in contiguous relation with the surface of the metallic body. Joining is carried out under heat and pressure.

Process 8) A varnish of a precursor of thermoplastic polyimide resin (2), a varnish of a precursor of non-thermoplastic polyimide resin and a varnish of a precursor of thermoplastic polyimide resin (1) are coated on a copper foil in this order. Drying and imidation are carried out. The resulting layers are stacked over a metallic body with the surface of the layer of thermoplastic polyimide resin (1) being in contiguous relation with the surface of the metallic body. Joining is carried out under heat and pressure and the copper foil is peeled off according to a well-known method.

Illustrated hereinafter are examples of preparation processes in which a varnish of a polyimide resin with adhesiveness or its precursor is coated on a metallic body, drying is carried out and imidation is also carried out, if necessary.

Process 1) A varnish of thermoplastic polyimide resin (2) or its precursor is coated on the surface of a metallic body. Drying is carried out. Imidation is also carried out, if necessary.

Process 2) A varnish of non-thermoplastic polyimide resin or its precursor is coated on the surface of a metallic body. Drying is carried out. Imidation is also carried out, if necessary.

Process 3) A varnish of a precursor of thermoplastic polyimide resin (1) or thermoplastic polyimide resin (2) and a varnish of a precursor of non-thermoplastic polyimide resin are coated on the surface of a metallic body in this order. Drying and imidation are carried out.

There are some kinds of timing to laminate polyimide layers on the bottom surface of a metallic body as mentioned above. There are two especially preferred processes. First, a copper foil for forming a circuit, a top polyimide layer, a metallic body and a bottom polyimide layer are laminated one over another in this order. The layers are joined under heat and pressure at the same time. Second, a copper foil for forming a circuit, a top polyimide layer, a metallic body, a bottom polyimide layer and a copper foil are laminated one over another in this order. The layers are also joined under heat and pressure at the same time.

The reasons are described in the following.

Reason 1) One step of lamination is sufficient because a top polyimide layer and a bottom polyimide layer are joined under heat and pressure at the same time.

Reason 2) When a metal-based semiconductor circuit substrate is drawn and bent, the processing accuracy depends on the thickness of its metallic body. If the top and bottom surfaces of a metallic body are covered with polyimide layers, the metallic body does not come in contact with a solution for etching a copper foil when a circuit is formed in the copper foil; thus, the thickness of the metallic body does not change.

Reason 3) Moreover, the following advantages are illustrated when a copper foil for forming a circuit, a top polyimide layer, a metallic body, a bottom polyimide layer and a copper foil are laminated one over another in this order.

3-1) Polyimide etching is carried out to form a via hole. The interior polyimide surface of the via hole is plated by electroless copper plating and by electrolytic copper plating so that the copper foil for forming the circuit is in continuous relation with the metallic body. When the bottom surface is covered with polyimide layers alone, a gas such as hydrogen and other gases is generated, blisters appear during electrolytic copper plating or peeling happens during conveyance because a layer of electroless copper plating has low electrical conductivity. Therefore, there happens a problem in that pieces of peeled copper foil and peeled copper powder pollute a plating bath. When most of the surface of the bottom polyimide layer is covered with copper foil, neither generation of a gas nor other problems happen and the bottom side is also plated smoothly.

3-2) In a metal-based semiconductor circuit substrate with detecting terminals, a copper foil, in which a pattern is formed, is used for an etching resist layer of the bottom side. A part of the bottom polyimide layer, which covers the detecting terminals, is optionally etched. It is possible to efficiently use the remains of the bottom polyimide layer, which cover parts of the bottom surface other than the detecting terminals.

3-3) One polyimide etching is to form a via hole on the side of forming a circuit. Another polyimide etching is to form detecting terminals on the bottom side. It is possible to carry out etching on both sides with a liquid or a gas at the same time. Liquids to etch polyimide layers include a well-known aqueous solution of hydrazine and KOH, a well-known aqueous solution of hydroxyoxime and KOH and other aqueous solutions. Preferred gases to etch polyimide layers include plasma gases such as $NF_3$, $CF_3$ and other compounds.

When a layer of thermoplastic polyimide resin (1) used for the present invention has the following properties, its resin may have any of chemical structures and other properties. Its glass transition temperature is at least 120° C. to at most 300° C. Its elastic modulus at a temperature 30° C. higher than the glass transition temperature is at most one-hundredth as large as that at the glass transition temperature, preferably at most one-thousandth as large as that at the glass transition temperature. When the layer of thermoplastic polyimide resin (1) is laminated on a layer of non-thermoplastic polyimide resin, the elongation percentage of the laminated film is at least 20%, preferable at least 30%. The elongation percentage is measured according to Rule ASTM-D882.

The peel adhesive strength of the polyimide layer to a metallic body is at least 0.5 kg/cm, preferably 0.8 kg/cm judging from lamination reliability.

If the glass transition temperature is lower than 120° C., the problems of blisters come to the fore during solder reflowing. If the glass transition temperature is higher than 300° C., high temperatures of 300° C. or more are necessary when the polyimide layer is stacked over a metallic body and joining is carried out under heat and pressure. Such high temperatures are not preferable from the viewpoint of production.

If the elastic modulus at a temperature 30° C. higher than the glass transition temperature is larger than one-hundredth of that at the glass transition temperature, high temperatures and pressures are necessary when the polyimide layer is laminated on a metallic body.

If a laminated film consisting of a layer of thermoplastic polyimide resin (1) and a layer of non-thermoplastic polyimide resin has an elongation percentage lower than 20%, cracks often appear during drawing.

The thickness of the layer of thermoplastic polyimide resin (1) is at least 0.5 µm to at most 10 µm, preferably at least 1 µm to at most 5 µm. If the thickness is larger than 10 µm, blisters can appear during solder reflowing due to absorbed water and ultrasonic waves are more easily absorbed during wire bonding. If the thickness is smaller than 0.5 µm, the adhesive property of the polyimide layer to a metallic body becomes low.

A layer of thermoplastic polyimide resin (2) of the present invention has a glass transition temperature of at least 200° C. to at most 350° C., preferably at least 230° C. to at most 300° C. Its elastic modulus at a temperature 30° C. higher than the glass transition temperature is at most one-tenth as large as that at the glass transition temperature, preferably at least one-thousandth as large as that at the glass transition temperature to at most one-fiftieth as large as that at the glass transition temperature. When the layer of thermoplastic polyimide resin (2) is laminated on a layer of non-thermoplastic polyimide resin, the elongation percentage of the laminated film is at least 20%. The elongation percent age is measured according to Rule ASTM-D882. When the layer of thermoplastic polyimide resin (2) has the above-mentioned properties, it may be the same as the layer of thermoplastic polyimide resin (1).

The peel adhesive strength of the polyimide layer to a metallic body is at least 0.5 kg/cm, preferably 0.8 kg/cm judging from lamination reliability.

If the glass transition temperature is lower than 200° C., ultrasonic waves are absorbed at temperatures of 200° C. or more during wire bonding. The property of wire bonding deteriorates and the polyimide resin is tacked to a jig for wire bonding. The layer of thermoplastic polyimide resin (2) has a large coefficient of thermal expansion; therefore, the glass transition temperature is important in that it is necessary to balance a coefficient of thermal expansion on the top side of a metallic body with a coefficient of thermal expansion on the bottom side of the metallic body. If the layer of thermoplastic polyimide resin (2) is used in combination with a layer of non-thermoplastic polyimide resin and its thickness is lower than 0.1 µm, its effect is small. If its thickness is larger than 10 µm, the total thickness of polyimide layers on the bottom side become thick and the heat resistance on the bottom side becomes large. If only the layer of thermoplastic polyimide resin (2) is laminated on a metallic body and its thickness is lower than 0.1 µm, its effect is small judging from balancing coefficients of thermal expansion. On the contrary, damage from bending and drawing happens easily. If its thickness is larger than 50 µm, the heat resistance on the bottom side becomes large.

A layer of non-thermoplastic polyimide resin used for the present invention has a glass transition temperature of at least 200° C. Its elastic modulus at a temperature 30° C. higher than the glass transition temperature is larger than one-tenth of that at the glass transition temperature. A 25-µm film, made of the non-thermoplastic polyimide resin alone, has an elongation percentage of at least 20%, preferably at least 30%. The elongation percentage is measured according to Rule ASTM-D882.

The peel adhesive strength of the polyimide layer to a metallic body is at least 0.5 kg/cm, preferably 0.8 kg/cm judging from lamination reliability.

If the glass transition temperature is lower than 200° C., ultrasonic waves are absorbed at temperatures of 200° C. or more during wire bonding and the property of wire bonding deteriorates. If the elongation percentage of the 25-µm film is lower than 20%, cracks appear easily in the film during drawing.

The total thickness of polyimide layers, laminated on the bottom surface of a metallic body of the present invention, is at least 0.5 µm to at most 50 µm, preferably at most 30 µm. If the thickness is larger than 50 µm, the heat radiation from the metallic body, which is one of characteristics of the metal-based semiconductor circuit substrate, is reduced in amount.

As mentioned above, the peel adhesive strength of the polyimide layer to a metallic body is at least 0.5 kg/cm, preferably 0.8 kg/cm judging from lamination reliability. Surface treatment of a metallic body and election of polyimide resins are important means to realize such peel adhesive strength. If such properties are fulfilled, any type can be used. Preferred examples of surface treatment of a metallic body include chromium oxide (Mitsubishi Shindoh Co., trade name: Plamate) treatment, some types of treatment with Ni—Cu alloy, Ni—Cu—Co alloy, Ni—Co—Mo—Cu alloy or other alloys, which are used for surface treatment of copper foil.

Preferred examples of thermoplastic polyimide resin (1) include polyimide resins disclosed in JP-A-62-053827 (Tokkaisho) such as a polyimide resin obtained by polymerizing 3,3'-diaminophenoxybenzene and 3,3',4,4'-benzophenonetetracarboxylic dianhydride and a polyimide resin obtained by polymerizing 3,3'-diaminophenoxybenzene and 3,3',4,4'-benzoethertetracarboxylic dianhydride and other polyimides.

Preferred examples of thermoplastic polyimide resin (2) include polyimide resins such as a polyimide resin obtained by polymerizing 3,3'-diaminobenzophenone and 3,3',4,4'-benzophenonetetracarboxylic dianhydride, a polyimide resin obtained by polymerizing 4,4'-diaminophenylether and 3,3',4,4'-biphenyltetracarboxylic dianhydride, a polyimide resin obtained by polymerizing 4,4'-bis(3-aminophenoxy) biphenyl and pyromellitic dianhydride, Regulus available from Mitsui Chemicals, Inc. and other polyimides.

Preferred examples of non-thermoplastic polyimide resin include polyimide resins such as a polyimide resin having adhesive properties after its precursor is coated on a metallic body to carry out drying and imidation, for example, a polyimide resin obtained by polymerizing a meta-coordinated aromatic diamine and a para-coordinated aromatic diamine at an equivalent ratio of 35 to 65 as disclosed in JP-62-208690 (Tokkaisho), Kapton H, V, E and EN-ZT on the market (Du Pont-Toray Co.), Upilex SGA (Ube Industries, Ltd.), Apical AH and NPI (Kaneka Corp.) and other polyimides.

It is preferable to adopt some of the above-mentioned measures against the warp of a substrate in order to carry out the present invention more efficiently. Examples of definite measures are illustrated in the following.

1) To make a substrate thick so far as its weight is within the weight limits and its thickness is not an obstacle to drawing, bending and forming detecting terminals.

2) To make a substrate elastic so far as its elasticity is not an obstacle to drawing and bending accuracy.

3) To make a polyimide resin for insulating a circuit decrease in thermal expansion so far as its thermal expansion is not an obstacle to lamination, resin etching, drawing and bending.

4) To make a solder resist layer thin and use a resin with low thermal expansion and elasticity as far as the solder resist layer meets the necessary conditions of reliability.

EXAMPLES

Example 1

In dimethylacetoamide solvent, 3,3'-diaminophenoxybenzene and 3,3',4,4'-benzophenonetetracarboxylic dianhydride were mixed at an equivalent ratio 1 to 0.99. Reaction was carried out at 25° C. for 24 hours to obtain an amic acid solution (hereinafter referred to as PAA-A). PAA-A was coated on both surfaces of Kapton H having a thickness of 25 μm (Du Pont-Toray Co.) with a die coater (duplex coating). Drying was carried out at a temperature of 100 to 200° C. Imidation and final drying were carried out at a temperature of 220 to 260° C. Each of polyimide A (hereinafter referred to as PI-A) layers, formed on both surfaces of Kapton H by imidation, was 5 μm in thickness. The laminate, which had a 5-μm layer of PI-A on each surface of Kapton H, was named as bond ply A.

PAA-A was coated on one surface of Kapton H having a thickness of 25 μm in the same way as it was coated on both surfaces. Drying and imidation were carried out in the same way as they were carried out in the duplex coating. The thickness of a PI-A layer, formed on one surface of Kapton H, was 3 μm. The laminate, which had a 3-μm layer of PI-A on one surface of Kapton H having a thickness of 25 μm was named as cover film A.

PI-A was a thermoplastic polyimide resin and had a glass transition temperature of 198° C. Its elastic modulus at the glass transition temperature was 1/700 of that at a temperature higher 30° C. than the glass transition temperature. Kapton H was a non-thermoplastic polyimide film and had a glass transition temperature of at least 400° C. and an elongation percentage of 80%. The bond ply A had an elongation percentage of 55%. The cover film A had an elongation percentage of 60%.

Next, 18-μm rolled copper foil 104 (BHN-02BT, Japan Energy Corporation), bond ply A, 0.3-mm copper body 002 (C-1020, Mitsubishi Shindoh Co.) and cover film A were stacked one over another in this order with the surface of the copper body being in contiguous relation with the surface of the thermoplastic polyimide layer of the cover film A. Press molding was carried out at 250° C. at 65 kg/cm² for 60 minutes in a vacuum. The copper body was a product whose surfaces were roughened in advance by Nihon Denkai Co. through electroplating of Ni, Co and other metals to improve them in adhesive strength. The mold was referred to as metal-based substrate (1). It was confirmed that the adhesive strength was at least 0.8 kg/cm at each of the interfaces of the metal-based substrate (1).

Figure 4:
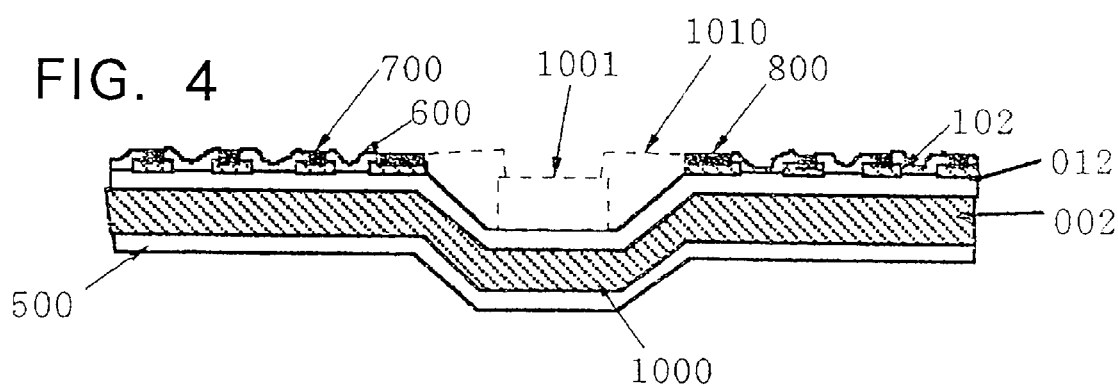
FIG. 4 is a cross-sectional type view of a metal-based semiconductor circuit substrate with die mounting base 1000 formed through drawing. The substrate consists of copper body 002, bond ply 012, copper circuit 102, bonding stitch 800, resist ink layer 600, Ni/Au plating layer 700 and bottom polyimide layer 500.
Figure 8:
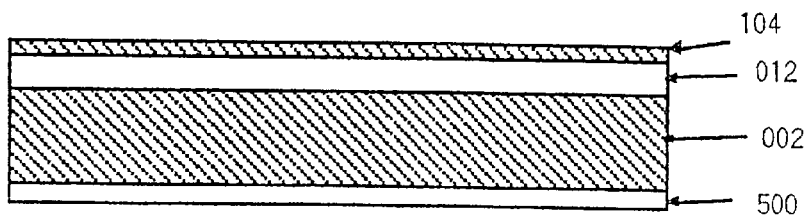
FIG. 8 is a cross-sectional type view of a metal-based substrate, which consists of copper body 002, bottom polyimide layer 500, bond ply 012 and rolled copper foil 104.

FIG. 8 is a cross-sectional type view of the metal-based substrate (1). In FIG. 8, 012 stands for bond ply A and 500 stands for cover film A. The laminate was used to produce a metal-based semiconductor circuit substrate as shown in FIG. 4. In FIG. 4, 012 stands for bond ply A and 500 stands for cover film A.

Production was carried out as follows. A pattern was drawn on the rolled copper foil with etching resist. The rolled copper foil was etched with cupric chloride to form copper circuit 102 and bonding stitch 800.

Photosensitive solder resist (PSR4000, Taiyo Ink Mfg.) was coated so that it was 20 μm in thickness on an electric conductor circuit. Next, a pattern was formed and resist ink layer 600 was formed. The metal-based substrate was drawn with a drawing depth of 0.4 mm to form die mounting base 100 (13 mm square). Plating layer 700 consisting of Ni plating layer (3 μm) and Au plating layer (0.5 μm) was formed by electroless plating to obtain a metal-based semiconductor circuit substrate (40 mm square) for a face-up type BGA package. The minimum radius of curvature in the drawing part was 0.8 mm.

The tests after the drawing processing showed that there were no abnormal cracks and other faults in appearance in the polyimide layer on each of both surfaces of the copper body. There was no plating on the surface of the bottom polyimide layer and no penetration of plating liquid at the interface between the cover film A and the copper body 002 although the bonding stitches and solder ball mounting pads on the circuit side were Ni- and Au-plated. FIG. 4 is a type view of a metal-based semiconductor circuit substrate on which semiconductor chip 1001 is mounted and wire bonding is carried out with gold wire 1010.

The IR absorption factor of the surface of the bottom polyimide layer was at least 90% and larger than 80% of that of the surface of a quad flat package (hereinafter referred to as QFP) encapsulated with a resin. The IR absorption factor was excellent.

Eutectic solder balls (0.76 mmφ) were mounted on the substrate. The resulting substrate was mounted on the surface of a mother board made of FR-4 at the same as time a QPF and other discrete parts were mounted in an IR reflowing furnace. The IR output was set to keep the surface temperature of FR-4 so that the maximum temperature was 230° C. The temperature of the metallic body of the metal-based semiconductor circuit substrate was measured with a thermocouple thermometer. The maximum temperature was 230° C.

After the above-mentioned mounting the metal-based semiconductor circuit substrate was destroyed mechanically to survey the joins of solder balls to the mother board. All solder balls were destroyed and the solder ball bonding was excellent. An LSI die was adhered to the die mounting base with an epoxy adhesive. Ends of wires of Au were wire bond connected to the pads of the LSI die and bonding stitches of the metal-based semiconductor substrate at 230° C. using ultrasonic waves. The wire bond joins were excellent and the polyimide resin on the bottom surface was not tacked to a jig for wire bonding. The heat resistance of the metal-based semiconductor circuit substrate was 12° C./W at a rate of air flow of 1 m/sec and the influence of the cover film on the bottom surface was minute.

Comparative Example 1

The same processing as in EXAMPLE 1 was carried out, except that cover film A was not laminated, to obtain a metal-based semiconductor circuit substrate for a BGA package. The bottom surface of the substrate was Ni- and Au-plated. The IR absorption factor of the surface was at most 30%. As shown In EXAMPLE 1, eutectic solder balls (0.76 mmφ) were mounted on the substrate. The substrate was mounted on a mother board made of FR-4 with a QFP and discrete parts. The IR output was set to keep the surface temperature of FR-4 so that the maximum temperature was 230° C. The temperature of the metallic body of the metal-based semiconductor circuit substrate was measured with a thermocouple thermometer. The maximum temperature was 180° C.

After the mounting, the metal-based semiconductor circuit substrate was destroyed mechanically to survey the joins of solder balls to the mother board. There were failures at the interface between the solder balls and the substrate and the bonding strength was minute.

The IR output was increased in the same way to keep the surface temperature of FR-4 at 280° C. The maximum temperature of the metallic body of the metal-based semiconductor substrate was increased to 230° C. and the joins between solder balls and the mother board became better. However, the QFP was encapsulated with a resin but there were blisters in part of the QFP. The heat resistance of the metal-based semiconductor circuit substrate was 11° C./W at a rate of air flow of 1 m/sec.

Example 2

PAA-A obtained in EXAMPLE 1 was coated on both surface of Kapton EN-ZT having a thickness of 25 $\mu$m (Du Pont-Toray Co.) in the same way as in EXAMPLE 1 to carry out drying and imidation. Each of PI-A layers, formed on both surfaces of Kapton EN-ZT by imidation, was 5 $\mu$m in thickness. The laminate, which had a 5-$\mu$m layer of PI-A on each of both surfaces of Kapton EN-ZT having a thickness of 25 $\mu$m, was named as bond ply A'.

The same cover film A as produced in Example 1 was prepared. Kapton EN-ZT was a non-thermoplastic polyimide film and had a glass transition temperature of at least 400° C. and an elongation percentage of 60%.

Next, 18-$\mu$m rolled copper foil, bond ply A', 0.2-mm copper body 002 and cover film A were stacked one over another in this order with the surface of the copper body being in contiguous relation with the surface of the thermoplastic polyimide layer of the cover film A. Press molding was carried out at 250° C. at 65 kg/cm² for 60 minutes in a vacuum. The rolled copper foil was a product available from Japan Energy Corporation (BHN-02BT). The copper body was a product available from Mitsubishi Shindoh Co. (C-1020). Nihon Denkai Co. roughened both surfaces by electroplating of Ni, Co and other metals to improve them in adhesive strength. The mold was referred to as metal-based substrate (2). It was confirmed that the adhesive strength was at least 1.0 kg/cm at each of the interfaces of the metal-based substrate (2).

FIG. 8 is a cross-sectional type view of metal-based substrate (2) In FIG. 8, 012 stands for bond ply A' and 500 stands for cover film A. The laminate was used in the same way as in EXAMPLE 1 to produce a metal-based semiconductor circuit substrate as shown in FIG. 4. In FIG. 4, 012 stands for bond ply A' and 500 stands for cover film A.

Production was carried out in the same way as in EXAMPLE 1. The rolled copper foil was processed to form copper circuit 102 and bonding stitch 800.

Figure 9:
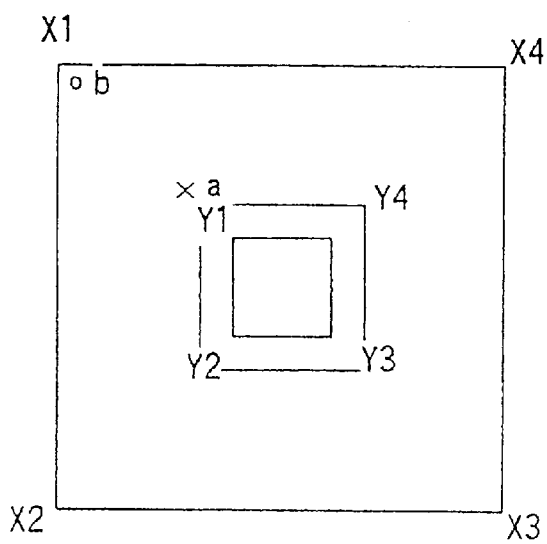
FIG. 9 is a plane type view of a metal-based semiconductor circuit substrate. The metal-based semiconductor circuit substrate has a cross-sectional type view as shown in FIG. 4 and is seen from the opposite side to its circuit surface.

Photosensitive solder resist (Tamura Seisakusho Co., trade name: BGX-5) was coated so that it was 20 $\mu$m in thickness on an electric conductor circuit. A pattern was formed and resist ink layer 600 was formed. The metal-based substrate (2) was drawn with a drawing depth of 0.4 mm to form die mounting base 1000 (13 mm square). Plating layer 700 consisting of Ni plating layer (3 $\mu$m) and Au plating layer (0.5 $\mu$m) was formed by electroless plating to obtain a metal-based semiconductor circuit substrate (40 mm square) for a face-up type BGA package. The minimum radius of curvature in the drawing part was 0.8 mm. FIG. 9 is a plane type view shown in the substrate's plane surface as seen from the opposite side to its circuit surface.

The test after the drawing processing showed that there were no abnormal cracks and other faults in appearance in the polyimide layer on each of both surfaces of the metallic body. Bonding stitches and solder ball mounting pads on the circuit side were Ni- and Au-plated. However, there was no plating on the surface of the bottom polyimide layer and no penetration of plating at the interface between the cover film A and the copper body 002.

In FIG. 9, the corners of a substrate were referred to as $X_1$, $X_2$, $X_3$ and $X_4$ and the exterior corners of the drawing part were referred to as $Y_1$, $Y_2$, $Y_3$ and $Y_4$. Corners $X_1$ and $Y_1$ were connected. Point "a" was 1 mm apart from corner $Y_1$ in the direction of corner $X_1$ on line $X_1$-$Y_1$. Point "b" was 1 mm apart from corner $X_1$ in the direction of corner $Y_1$ on line $X_1$-$Y_1$. Point "a" was the standard point. The height of point "b" from the standard point was measured using a laser displacement gauge of the non-contact type (Keyence Co., LT-8110). Measurement was carried out at 25° C. and 30% RH, and 185° C. after heating. The difference in height between points "b" and "a" was considered to be a warp. When point "b" was higher, a mark of "+" was used. Molding was regulated so that there was a warp of 0 $\mu$m at 25° C. The measured value was +60 $\mu$m at 185° C. The warp was within such a range that there was no trouble in mounting the substrate.

An LSI die was adhered to the die mounting base with an epoxy adhesive. Ends of wires of Au were bond connected to the pads of the LSI die and bonding stitches of the metal-based semiconductor substrate at 230° C. using ultrasonic waves. The wire bond joins were excellent and the polyimide resin on the bottom surface was not tacked to a jig for wire bonding. The heat resistance of the metal-based semiconductor circuit substrate was 12° C./W at a rate of air flow of 1 m/sec. The influence of the cover film on the bottom surface was minute.

Comparative Example 2

The same processing as in EXAMPLE 2 was carried out, except that cover film A was not laminated, to obtain a metal-based semiconductor circuit substrate for a BGA package. The bottom surface of the circuit substrate was Ni-plated (3 $\mu$m) and then Au-plated (0.5 $\mu$m). Molding was regulated so that there was a warp 0 $\mu$m at 25° C. and 30% RH. The warp had a value of +380 $\mu$m at 185° C. after heating and was such that mounting could not be carried out. The heat resistance of the metal-based semiconductor circuit substrate was 11° C./W at a rate of air flow of 1 m/sec.

Example 3

A polyimide film (Regulus PM, Mitsui Chemicals, Inc.) was used for a thermoplastic polyimide layer laminated on the bottom surface of a metallic body. The film had a glass transition temperature of 240° C., an elastic modulus of $3 \times 10^{10}$ dyn/mm² at 240° C., an elastic modulus of $2 \times 10^8$ dyn/mm² at 270° C. (2/300 of that at 240° C.), a thickness of 25 $\mu$m and an elongation percentage of 15%. A laminate consisting of Regulus PM and a copper body had an elongation percentage of 12%.

Figure 10:
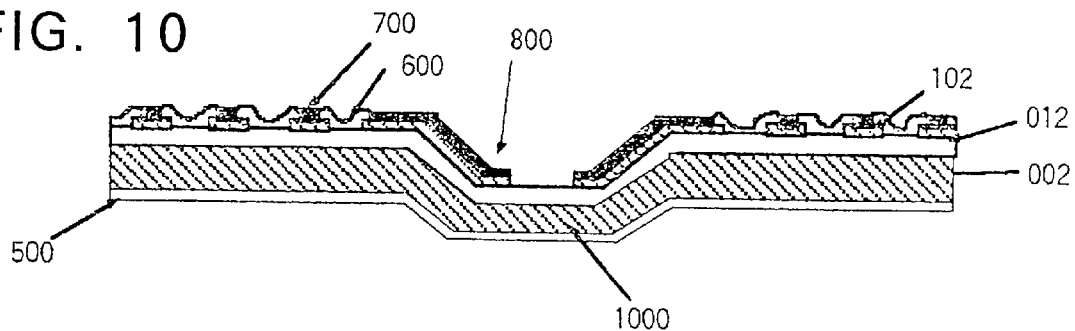
FIG. 10 is a cross-sectional type view of a metal-based substrate, in which one end of bonding stitch 800 is formed on the bottom of the drawing part.

Rolled copper foil 104, Regulus PM copper body 002 (C-1020, Mitsubishi Shindoh Co.), bond ply A' and rolled copper foil 104 were stacked one over another in this order. Press molding was carried out at 260° C. at 65 kg/cm² for 60 minutes in a vacuum. The mold was referred to as metal-based substrate (3). It was confirmed that the adhesive strength was at least 0.8 kg/cm at each of the interfaces of the metal-based substrate (3). The metal-based substrate was processed in the same way as the metal-based substrate (1) of EXAMPLE 1 to obtain a metal-based semiconductor circuit substrate for a BGA package. When a copper circuit was formed, the copper foil 104, laminated on Regulus PM, was removed. Processing was carried out so that bonding stitch 800 extended the circuit and one end of it was located on the bottom of the drawing part as shown in FIG. 10.

The test after the drawing processing showed that there were no abnormal cracks and other faults in appearance in the polyimide layer on each of both surfaces of the metallic body. Bonding stitches and solder ball mounting pads on the circuit side were Ni- and Au-plated. However, there was no plating on the surface of the bottom polyimide layer and no penetration of plating liquid at the interface between the Regulus PM and the copper body 002.

Molding was regulated in the same way as that of EXAMPLE 2 so that there was a warp of 0 $\mu$m at 25° C. and 30% RH. The warp had a value of +30 $\mu$m at 185° C. after heating. The variation was extremely small so that the mounting property was excellent.

An LSI die adhered to the die mounting base with an epoxy adhesive. Using ultrasonic waves at 185° C., ends of wires of Au were bond connected to the pads of the LSI die and bonding stitches of the metal-based semiconductor substrate. The wire bond joins were excellent and the polyimide resin on the bottom surface was not tacked to a jig for wire bonding. The heat resistance of the metal-based semiconductor circuit substrate was 12° C./W at a rate of air flow of 1 m/sec. The influence of Regulus PM as the cover film on the bottom surface was minute.

Example 4

Figure 11:
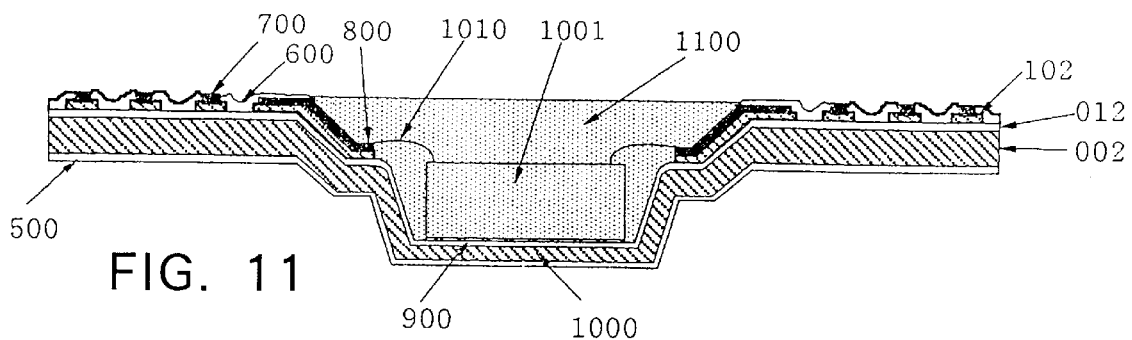
FIG. 11 is a cross-sectional type view of a metal-based semiconductor circuit substrate under processing. Bonding stitch 800 is formed on the interior surface of a first-stage cavity, die mounting base 1000 is formed to be a part of the interior surface of a second-stage cavity. Semiconductor chip 1001 is adhered to the die mounting base 1000 with die attaching material 900. The semiconductor chip and bonding stitch are connected to each other with gold wire 1010. The substrate is sealed with liquefied sealing material 1100.

The same metallic body 001 as shown in EXAMPLE 1 was used and processed in the same way as in EXAMPLE 1 to obtain a circuit substrate for an LGA package. The substrate was processed to obtain a metal-based semiconductor circuit substrate having a two-stage drawing structure as shown in FIG. 11.

The metal-based semiconductor circuit substrate was processed so that bonding stitch 800 was located on the interior surface of the first-stage cavity. Die mounting base 1000 for mounting semiconductor chip was formed to be a part of the interior surface of the second-stage cavity. The radius of curvature of the first-stage cavity was larger than that of the second-stage cavity. FIG. 11 is a cross-sectional type view of a metal-based semiconductor circuit substrate. Semiconductor chip 1001 was mounted on the substrate. The bonding pads of the semiconductor chip and bonding stitches of the substrate were connected to each other with gold wire 1010. The substrate was sealed with liquefied sealing material 1100. As shown in FIG. 11, the surface of the liquefied sealing material was not over that surface of the land so that an LGA package could be mounted on a mother board more easily.

Example 5

In N-methylpyrrolidone, 3,3'-diaminobenzophenone and 3,3',4,4'-benzophenonetetracarboxylic dianhydride were mixed at an equivalent ratio of 1 to 0.99. Reaction was carried out at 25° C. for 24 hours to obtain an amic acid solution (hereinafter referred to as PAA-L).

In N-methylpyrrolidone, 4,4'-diaminodiphenylether 1,4-diaminobenzene and pyromellitic dianhydride were mixed at an equivalent ratio of 0.6:0.4:0.993. Reaction was carried out at 25° C. for 24 hours to obtain an amic acid solution (hereinafter referred to as PAA-K).

PAA-L was coated on a treated surface of 18-$\mu$m rolled copper foil 104 and was dried to be free from adhesion.

PAA-K was coated on the PAA-L layer and was dried to be free from adhesion. PAA-A was coated on the PAA-K layer to dry the whole of coated amic acids in order to carry out imidation. The remaining solvent in the polyimide layer was 0.1% by weight. A polyimide layer resulting from the imidation of PAA-A were referred to as PI-L; a polyimide layer resulting from the imidation of PAA-K, PI-K.

A laminate consisting of rolled copper foil 104, PI-L, PI-K and PI-A was referred to as lapping film LKA. Polyimide layer PI-L formed on the rolled copper foil 104 was 1.5 $\mu$m in thickness; PI-K, 6.0 $\mu$m in thickness; PI-A, 2.5 $\mu$m. The total sum of the polyimide layers was 10 $\mu$m in thickness.

Polyimide layers PI-L and PI-K were independently prepared under the same drying and imidation conditions to measure their characteristics. The glass transition temperature of PI-L was 250° C.; that of PI-K, at least 400° C. The elastic modulus of PI-L at a temperature higher 30° C. than its glass transition temperature was 1/90 of that at its glass transition temperature. The elastic modulus of PI-K at a temperature higher 30° C. than its glass transition could not be measured.

The rolled copper foil 104 of the lapping film LKA was removed by etching to obtain a polyimide laminate. The elongation percentage of the polyimide laminate was 28%.

Figure 12:
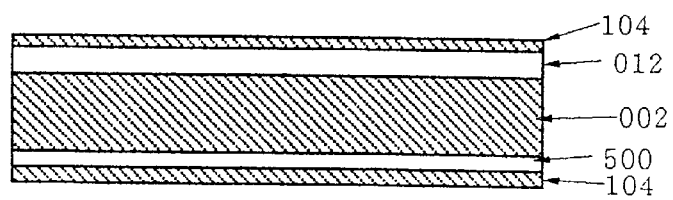
FIG. 12 is a cross-sectional type view of a metal-based substrate, which consists of copper body 002, bottom polyimide layer 500, bond ply 012 and rolled copper foil 104.

Next, 18-$\mu$m rolled copper foil 104, bond ply A', 0.2-mm copper body 002 and lapping film LKA were stacked one over another in this order with the surface of the copper body 002 being in contiguous relation with the surface of the polyimide layer of the lapping film LKA. The copper body 002 was a product available from Mitsubishi Shindoh Co. (C194-SH) and Nihon Denkai Co. roughened both of its surfaces by electroplating of Ni, Co and other metals to improve them in adhesive strength. Press molding was carried out at 250° C. at 65 kg/cm$^2$ for 60 minutes in a vacuum. The mold was referred to as metal-based substrate (4). The adhesive strength was at least 0.8 kg/cm at each of the interfaces of the metal-based substrate(4). The type view of this substrate is shown in FIG. 12. This laminate was used to form a circuit in the rolled copper foil and a resist ink layer in the same way as in EXAMPLE 2.

The copper foil of the lapping film was removed by full etching.

The thus-obtained metal-based substrate(4) was drawn with a drawing depth of 0.4 mm to form a die mounting base (13 mm square). A plating layer consisting of Ni plating layer (3 $\mu$m) and Au plating layer (0.5 $\mu$m) was formed by electroless plating to obtain a metal-based semiconductor circuit substrate (40 mm square) for a face-up type BGA package as shown in FIG. 4. The minimum radius of curvature in the drawing part was 0.8 mm.

The test after the drawing processing showed that there were no abnormal cracks and other faults in appearance in the polyimide layer on each of both surfaces of the metallic body. There was no plating on the surface of the bottom polyimide layer although the bonding stitches and solder ball mounting pads on the circuit side were Ni- and Au-plated.

Molding was regulated so that there was a warp of −30 $\mu$m at 25° C. and 30% RH. The warp had a value of +80 $\mu$m at 185° C. The variation was within an extremely small range so that mounting could be carried out sufficiently.

An LSI die was adhered to the die mounting base with an epoxy adhesive. Using ultrasonic waves at 230° C., ends of wires of Au were wire bond connected to the pads of the LSI die and bonding stitches of the metal-based semiconductor circuit substrate. The wire bond joins were excellent and the polyimide resin on the bottom surface was not tacked to a jig for wire bonding. The heat resistance of the metal-based semiconductor circuit substrate was 11.5° C./W at a rate of air flow of 1 m/sec. The influence of the polyimide film on the bottom surface was extremely minute.

Example 6

First, 18-μm rolled copper foil 104, bond ply A, 0.3-mm copper body 002 (C-1020, Mitsubish Shindoh Co.) and lapping film LKA were stacked one over another in this order. Press molding was carried out at 250° C. at 65 kg/cm² for 60 minutes in a vacuum. The mold was referred to as metal-based substrate (5). The adhesive strength was at least 0.8 kg/cm at each of the interfaces of the metal-based substrate (5).

The laminate was used to form a circuit in the rolled copper foil on the bond ply A side and a resist ink layer in the same way as in Example 4. The rolled copper foil of the lapping film side was removed by full etching.

The metal-based substrate was drawn with a drawing depth of 0.4 mm to form a die mounting base (13 mm square). A plating layer consisting of Ni plating layer (3 μm) and Au plating layer (0.5 μm) was formed by electroless plating to obtain a metal-based semiconductor circuit substrate (40 mm square) for a face-up type BGA package as shown in FIG. 4. The minimum radius of curvature in the drawing part was 0.8 mm.

The test after the drawing processing showed that there were no abnormal cracks and other faults in the polyimide layer on each of both surfaces of the metallic body. There was no plating on the surface of the bottom polyimide layer although bonding stitches and solder ball mounting pads on the circuit side were Ni- and Au-plated. The IR absorption factor of the surface of the bottom polyimide layer was at least 90%.

Eutectic solder ball (0.76 mmφ) were mounted on the substrate. The resulting substrate was mounted on the surface of a mother board made of FR-4 at the same time as a QPF and other discrete parts were mounted in an IR reflowing furnace according to a well-known method. The IR output was set to keep the surface temperature of FR-4 so that the maximum temperature was 240° C. The temperature of the metallic body of the semiconductor circuit substrate was measured with a thermocouple thermometer. The maximum temperature was 240° C.

After the mounting, the metal-based semiconductor circuit substrate was destroyed mechanically to survey the joins of solder balls to the mother board. All solder balls were destroyed so that the solder ball bonding was excellent.

An LSI die was adhered to a die mounting base with an epoxy adhesive. Ends of wires of Au were wire bond connected to the pads of the LSI die and bonding stitches of the metal-based semiconductor substrate at 230° C. using ultrasonic waves. The wire bond joins were excellent and the polyimide resin on the bottom surface was not tacked to a jig for wire bonding. The heat resistance of the metal-based semiconductor circuit substrate was 11.5° C./W at a rate of air flow of 1 m/sec and the influence of the polyimide film formed on the bottom surface was minute.

Example 7

The following processing was carried out using the same metal-based substrate (5) as obtained in EXAMPLE 6 to obtain a metal-based semiconductor circuit substrate with detecting terminals. A 0.25-mmφ hole was made in the rolled copper foil being in contiguous relation with bond ply A by etching with a solution of cupric chloride to make the polyimide layer exposed. Its position corresponded to a pad for mounting a solder ball.

A doughnut-like hole held between concentric circles (an internal circle of 0.55 mmφ and an external circle of 0.8 mmφ) was made in the copper foil of the lapping film LKA by etching with a solution of cupric chloride to make the polyimide layer exposed. Its position had the same coordinates as the above-mentioned hole and was opposite to the hole. The holes on both sides were formed at the same time.

Figure 5A:
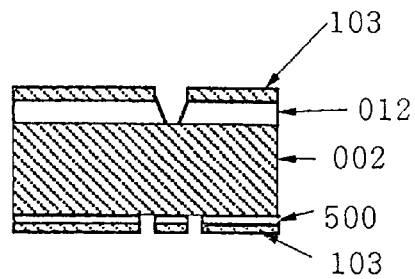
FIG. 5A is a partially cross-sectional type view of a metal-based semiconductor circuit substrate under processing. The substrate consists of copper body 002, bond ply 012, copper pattern 103 and bottom polyimide layer 500. The bond ply and bottom polyimide layers are etched so that the desired parts of the copper body can be seen.
Figure 5B:
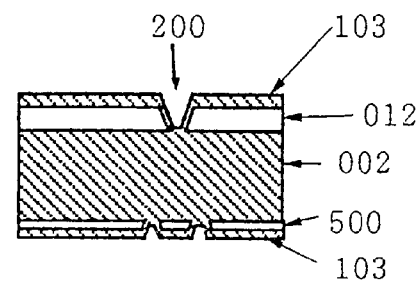
FIG. 5B is a partially cross-sectional type view of a metal-based semiconductor circuit substrate under processing. Copper plating is carried out to form BVH 200 following the processing step in FIG. 5A.

Each of the polyimide layers on both surfaces of copper body 002 was removed by laser etching to expose the copper body. The shape of the surfaces of the copper body 002 exposed were a circle of 0.23 mmφ and a doughnut-like figure held between an internal circle of 0.56 mmφ and an external circle of 0.79 mmφ (see FIG. 5A). The surface of the metal-based substrate on the bond ply A side was plated by electroless copper plating or by electric copper plating to form BVH 200 in order to realize a state of continuity between the copper body and the copper foil (see FIG. 5B). During the copper plating, the surface on the bottom side was also copper-plated. However, there were neither blisters of copper plating nor peeling of it.

Figure 5C:
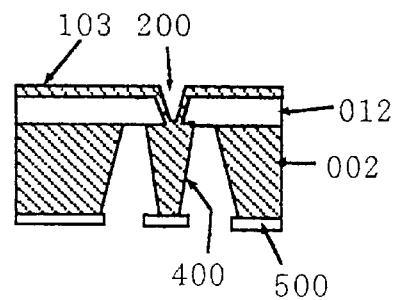
FIG. 5C is a partially cross-sectional type view of a metal-based semiconductor circuit substrate under processing. The copper body is etched to form detecting terminal 400 following the processing step in FIG. 5B.

The polyimide layer of the lapping film as the etching resist layer for the copper body was used to etch the copper body with a solution of cupric chloride and form a doughnut-like hole in order to form detecting terminal 400 (see FIG. 5C).

Figure 6:
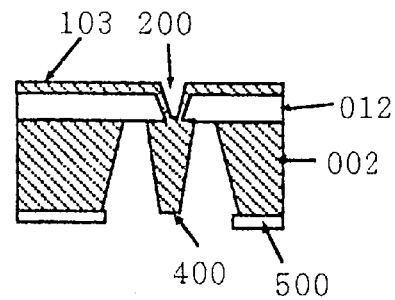
FIG. 6 is a partially cross-sectional type view of a metal-based semiconductor circuit substrate with detecting terminal under processing. The substrate is formed through etching the metal-based semiconductor circuit substrate as shown in FIG. 5C to remove bottom polyimide layer 500 on detecting terminal 400.
Figure 7:
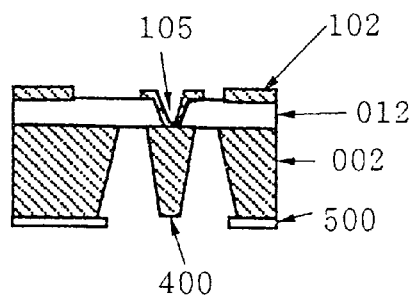
FIG. 7 is a cross-sectional type view of a metal-based semiconductor circuit substrate with detecting terminals under processing. The substrate is obtained through processing copper pattern 103 as shown in FIG. 6 to form ball mounting pad 105 and copper circuit 102.

The resulting substrate was processed by laser etching to remove an unnecessary part of the polyimide layer in order to form a substrate as shown in FIG. 6. A circuit was formed in the copper foil on the bond ply A side and copper circuit 102 and ball mounting pad 105 were formed. The cross-sectional shape of the thus-obtained substrate is shown in FIG. 7. A projection resulting from the copper body was a detecting terminal for a ball mounting pad. A resist ink layer was formed on the circuit side.

The thus-obtained metal-based substrate was drawn with a drawing depth of 0.4 mm to form a die mounting base (13 mm). A plating layer consisting of Ni plating layer (3 μm) and Au plating layer (0.5 μm) was formed by electroless plating to obtain a metal-based semiconductor circuit substrate (40 mm square) for a face-up type BGA package.

Only the bonding stitches, solder ball mounting pads and detecting terminals were Ni- and Au-plated and there was no plating on the surface of the bottom polyimide layer. The IR absorption factor of the surface of the bottom polyimide layer was at least 90%.

Eutectic solder balls (0.76 mmφ) were mounted on the substrate. The resulting substrate was mounted on the surface of a mother board made of FR-4 at the same time as a QFP and other discrete parts were mounted in an IR reflowing furnace according to a well-know method. The IR output was set to keep the surface temperature of FR-4 so that the maximum temperature was 240° C. The temperature of the metallic body of the semiconductor circuit substrate was measured with a thermocouple thermometer. The maximum temperature was 240° C.

After the mounting, the metal-based semiconductor circuit substrate was destroyed mechanically to survey the joins of solder balls to the mother board. All solder balls were destroyed so that the solder ball bonding was excellent. The heat resistance of the metal-based semiconductor circuit substrate was 12° C./W at a rate of air flow of 1 m/sec.

Example 8

The following processing was carried out using the same metal-based substrate (4) as obtained in EXAMPLE 5 to obtain a metal-based substrate with detecting terminals. A 0.25-mmφ hole was formed in the rolled copper foil being in contiguous relation with bony ply A' by etching with an aqueous solution containing cupric chloride to make the polyimide layer exposed. Its position corresponded to a pad for mounting a solder ball.

A 0.8-mmφ hole was made in the copper foil of lapping film LKA by etching with an aqueous solution containing cupric chloride to make the polyimide layer exposed. Its position has the same coordinates as the above-mentioned hole and was opposite to the hole.

Figure 15A:
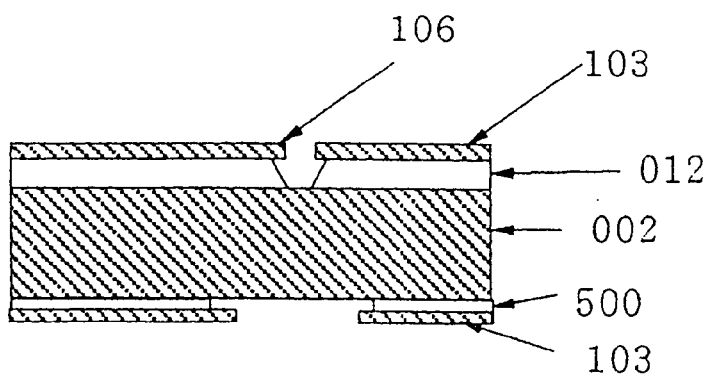
In FIG. 15A is a partially cross-sectional type view of a metal-based semiconductor circuit substrate under processing. The substrate consists of copper body 002, bond ply 012, copper pattern 103 and bottom polyimide layer 500. The bond ply and bottom polyimide layer are etched so that the desired part of the copper body can be seen.
Figure 15B:
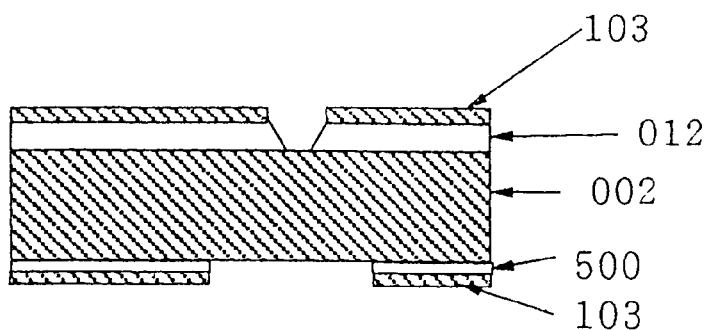
FIG. 15B is a partially cross-sectional type view of a metal-based semiconductor circuit substrate under processing. Copper pattern is etched slightly to remove overhanging part 106 of the copper pattern in FIG. 15A following the processing step in FIG. 15A.
Figure 15C:
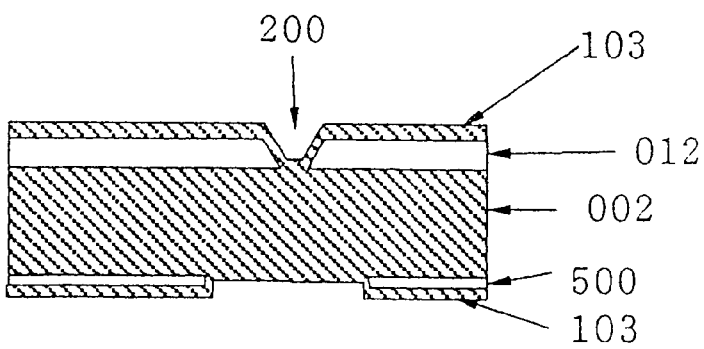
FIG. 15C is a partially cross-sectional type view of a metal-based semiconductor circuit substrate under processing. Copper plating is carried out to form BVH 200 following the processing step in FIG. 15B.

The polyimide layers on both surfaces of copper body 002 were removed by etching with an aqueous solution containing hydrazine and KOH to expose the copper body. The shape of the surfaces of the copper body 002 exposed were circles of 0.23 mmφ and 0.83 mmφ, respectively (see FIG. 15A). An overhanging part of the copper foil was etched slightly to remove (see FIG. 15B). Both surfaces of the metal-based substrate were plated by electroless copper plating or by electric copper plating to form BVH 200 in order to realize a state of continuity between the copper body 002 and the copper foil.

A pattern was drawn with an etching resist to form a detecting terminal in the copper foil of the lapping film. The copper body was etched to form a doughnut-like hole in order to form detecting terminal 400.

The remaining etching resist was removed with a release solution in order to form a substrate as shown in FIG. 6. Copper pattern 103 on the bond ply was processed to form a circuit. Copper circuit 102 and ball mounting pad 105 were formed. The cross-sectional shape of the thus-obtained substrate is shown in FIG. 7. A projection resulting from the copper body was a detecting terminal for a ball mounting pad. A solder resist layer was formed on the circuit side.

The thus-obtained metal-based circuit substrate was drawn with a drawing depth of 0.4 mm to form a die mounting base (13 mm square). A plating layer consisting of Ni plating layer (3 μm) and Au plating layer (0.5 μm) was formed by electroless plating to obtain a metal-based semiconductor circuit substrate (40 mm square) for a face-up type BGA package.

Only the bonding stitches, solder ball mounting pads and detecting terminals were Ni- and Au-plated. However, there was no plating on the surface of the bottom polyimide layer.

Molding was regulated so that there was a warp of −30 μm at 25° C., 30% RH. The warp had a value of +110 μm at 185° C. The variation was within a small range so that mounting could be carried out sufficiently. The heat resistance of the metal-based semiconductor circuit substrate was 12° C./W at a rate of air flow of 1 m/sec.

Example 9

Figure 13:
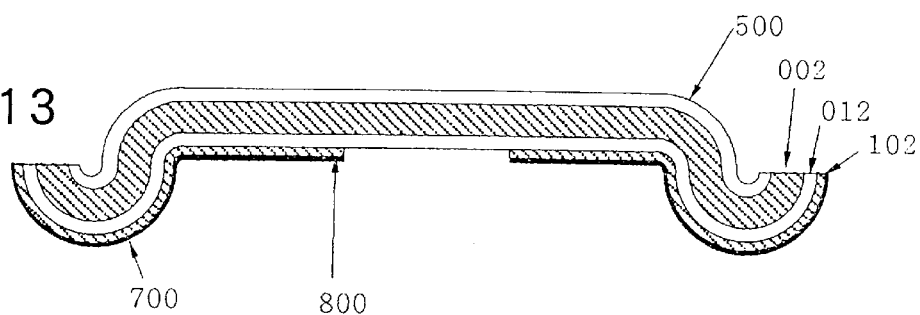
FIG. 13 is a cross-sectional type view of a metal-based semiconductor circuit substrate of the MQP type, which consists of copper body 002, bottom polyimide layer 500, bond ply 012 and copper circuit 102.

The same metal-based substrate (5) as obtained in EXAMPLE 6 was used to form a circuit in the copper foil in contiguous relation with bond ply A. The metal-based substrate was drawn to obtain a metal-based semiconductor circuit substrate of the MQP type as shown in FIG. 13. The minimum radius of curvature in the drawing part was 1 mm.

The test after the drawing processing showed that there were no abnormal cracks and other faults in appearance in the polyimide layers 012 and 500 on both surfaces of the copper body 002. There was no plating on the surface of the bottom polyimide layer although the circuit side was Ni- and Au-plated.

The IR absorption factor of the surface of the bottom polyimide layer was at least 90%. The substrate was mounted on the surface of a mother board made of FR-4 at the same time as a QPF and other discrete parts were mounted in an IR reflowing surface according to a well-known method in which solder cream was used.

The IR output was set to keep the surface temperature of FR-4 so that the maximum temperature was 230° C. The temperature of the copper body of the metal-based semiconductor circuit substrate was measured with a thermocouple thermometer. The maximum temperature was 230° C.

After the mounting, a sufficient amount of solder rose to a part of the lead-like copper circuit of an MQP. The fact showed that the temperature of the lead-like copper circuit was sufficient for solder bonding.

Example 10

Figure 14:
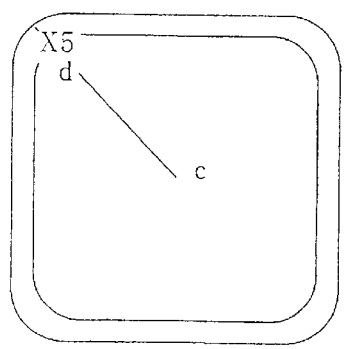
FIG. 14 is a plane type view of a metal-based semiconductor circuit substrate. The metal-based semiconductor circuit substrate has a cross-sectional type view as shown in FIG. 13 and is seen from the opposite side to its circuit surface.

The same metal-based substrate (2) as obtained in EXAMPLE 2 was used to form a circuit in the copper foil in contiguous relation with bond ply A'. The metal-based substrate (2) was drawn to obtain a metal-based semiconductor circuit substrate of the MQP type. Its cross-sectional type view is shown in FIG. 13. Its plane type view as seen from the opposite side to its circuit surface is shown in FIG. 14. The minimum radius curvature in the drawing part was 1 mm.

The test after the drawing processing showed that there were no abnormal cracks and other faults in appearance in the polyimide layers 012 and 500 on both surfaces of the copper body 002. There was no plating on the surface of the bottom polyimide layer although the circuit side was Ni- and Au-plated.

In FIG. 14, the center of the bottom side was referred to as point "c". Point "d" was 1 mm apart from corner $X_5$ in the direction of point "c" on line $X_5$-c. Point "c" was considered as the standard point to measure the height of point "d" from the standard point. Measurement was carried out at 25° C. and 30% RH, and 185° C. after heating. The difference in height between points "c" and "d" was considered to be a warp. When point "d" was higher, a mark of "+" was used. Molding was regulated so that there was a warp of 0 μm at 25° C. and 30% RH. The warp had a value of 10 μm at 185° C. after heating. The variation resulting from temperature changes was 10 μm. The variation in shape due to temperature changes was minute. The sample showed properties preferred for a metal-based semiconductor circuit substrate.

Comparative Example 3

The same processing as in EXAMPLE 9 was carried out, except that cover film A was not laminated, to obtain a metal-based semiconductor circuit substrate of the MQP type. The bottom surface of the circuit substrate was Ni-plated (3 μm) and then Au-plated (0.5 μm). Molding was regulated so that there was a warp of 0 μm at 25° C. and 30% RH. The warp had a large value of +60 μm at 185° C. after heating. The warp in the die mounting base was large due to temperature changes. There was a peel stress between the substrate and the IC chip. It was expected that the metal-based semiconductor circuit substrate was inferior to that of EXAMPLE 9 in bonding reliability.

We claim:

1. A metal-based semiconductor circuit substrate comprising:
   a metallic body having a top surface and a bottom surface opposite to said top surface, wherein a polyimide resin is used for forming a dielectric layer on said top surface and a circuit is formed on said dielectric layer;

a layer of thermoplastic polyimide resin which has a glass transition temperature of at least 120° C. to at most 300° C. and an elastic modulus at a temperature 30° C. higher than the glass transition temperature, said layer of thermoplastic polyimide resin being laminated on said bottom surface, said elastic modulus being at most one-hundredth as large as that of said layer of thermoplastic polyimide resin at the glass transition temperature; and a layer of non-thermoplastic polyimide resin which has a glass transition temperature of at least 200° C. and an elastic modulus at a temperature 30° C. higher than the glass transition temperature, said layer of non-thermoplastic polyimide resin being laminated on said layer of thermoplastic polyimide resin, said elastic modulus being more than one-tenth of that of said layer of non-thermoplastic polyimide resin at the glass transition temperature, wherein a 25-μm film consisting of said non-thermoplastic polyimide resin alone has an elongation percentage of at least 20%.

2. A metal-based semiconductor circuit substrate as in claim 1, further comprising a layer of thermoplastic polyimide resin which has a glass transition temperature of at least 200° C. to at most 300° C. and an elastic modulus at a temperature 30° C. higher than the glass transition temperature, said layer of thermoplastic polyimide resin being laminated on said layer of non-thermoplastic polyimide resin, said elastic modulus being at most one-tenth as large as that of said layer of thermoplastic polyimide resin at the glass transition temperature.

3. A metal-based semiconductor circuit substrate comprising:

a metallic body having a top surface and a bottom surface opposite to said top surface, wherein a polyimide resin is used for forming a dielectric layer on said top surface and a circuit is formed on said dielectric layer;

a layer of thermoplastic polyimide resin which has a glass transition temperature of at least 200° C. to at most 300° C. and an elastic modulus at a temperature 30° C. higher than the glass transition temperature, said layer of thermoplastic polyimide resin being laminated on said bottom surface, said elastic modulus being at most one-tenth as large as that of said layer of thermoplastic polyimide resin at the glass transition temperature.

4. A metal-based semiconductor circuit substrate comprising:

a metallic body having a top surface and a bottom surface opposite to said top surface, wherein a polyimide resin is used for forming a dielectric layer on said top surface and a circuit is formed on said dielectric layer; and a layer of non-thermoplastic polyimide resin which has a glass transition temperature of at least 200° C.; and an elastic modulus at a temperature 30° C. higher than the glass transition temperature, said layer of non-thermoplastic polyimide resin being laminated on said bottom surface, said elastic modulus being more than one-tenth of that of said layer of non-thermoplastic polyimide resin at the glass transition temperature, wherein a 25-μm film consisting of said layer of non-thermoplastic polyimide resin alone has an elongation percentage of at least 20%.

5. A metal-based semiconductor circuit substrate as in any of claims 1–4, wherein a polyimide laminate formed on said bottom surface has a coefficient of thermal expansion of 14×10⁻⁶/deg. to 60×10⁻⁶/deg. at 25° C., and an elongation percentage of 5 to 120%, a polyimide layer being outermost from said metallic body has a glass transition temperature of at least 200° C. and a polyimide layer being innermost from said metallic body has an amount of adhesive strength to said metallic body of at least 0.5 kg/cm.

6. A metal-based semiconductor circuit substrate as in any of claims 1–4, wherein the total sum of the thickness of each polyimide layer is in the range of 0.5 to 50 μm.

7. A metal-based semiconductor circuit substrate as in claim 1 or 2, wherein the thickness of said layer of thermoplastic polyimide resin is in the range of 0.1 to 10 μm.

8. A metal-based semiconductor circuit substrate as in any of claims 1–4, wherein said metal-based semiconductor circuit substrate has a cavity formed by drawing.

9. A metal-based semiconductor circuit substrate as in claim 8, wherein said semiconductor circuit substrate is a ball grid array substrate.

10. A metal-based semiconductor circuit substrate as in claim 9, wherein said cavity has a two-stage structure, said first cavity's interior surface being a space for forming a bonding stitch, said second cavity's interior surface being a space for mounting a chip or a space for both of forming a bonding stitch and mounting a chip.

11. A metal-based semiconductor circuit substrate as in claim 8, wherein said semiconductor circuit substrate is a land grid array substrate.

12. A metal-based semiconductor circuit substrate as in claim 11, wherein said cavity has a two-stage structure, said first cavity's interior surface being a space for forming a bonding stitch, said second cavity's interior surface being a space for mounting a chip or a space for both of forming a bonding stitch and mounting a chip.

13. A metal-based semiconductor circuit substrate as in claim 8, wherein said semiconductor circuit substrate has a metal quad package structure.

14. A metal-based semiconductor circuit substrate as in claim 9, wherein said metal-based semiconductor circuit substrate is a ball grid array substrate having a structure of detection terminals in a part of said bottom surface and having a polyimide layer as a cover in a remaining part of said bottom surface.

* * * * *